United States Patent [19]
Beasom

[11] Patent Number: 5,895,953
[45] Date of Patent: Apr. 20, 1999

[54] OHMIC CONTACT TO LIGHTLY DOPED ISLANDS FROM A CONDUCTIVE RAPID DIFFUSION BURIED LAYER

[75] Inventor: James Douglas Beasom, Melbourne Village, Fla.

[73] Assignee: Harris Corporation, Melbourne, Fla.

[21] Appl. No.: 08/810,127

[22] Filed: Feb. 25, 1997

Related U.S. Application Data

[62] Division of application No. 08/336,768, Nov. 9, 1994, Pat. No. 5,643,821.

[51] Int. Cl.$^6$ ............................. H01L 23/48; H01L 23/52
[52] U.S. Cl. .................. 257/751; 257/506; 257/508; 257/757; 438/355; 438/405; 148/DIG. 12
[58] Field of Search ........................ 257/506, 508, 257/751, 757; 438/405, 355, 455; 148/DIG. 12

[56] References Cited

U.S. PATENT DOCUMENTS

| | | |
|---|---|---|
| 4,794,445 | 12/1988 | Homma et al. |
| 4,826,787 | 5/1989 | Muto et al. |
| 4,839,309 | 6/1989 | Easter et al. |
| 4,948,748 | 8/1990 | Kitahara et al. |
| 5,003,365 | 3/1991 | Havemann et al. |
| 5,004,705 | 4/1991 | Blackstone ............ 438/405 |
| 5,098,861 | 3/1992 | Blackstone |
| 5,369,304 | 11/1994 | Lesk et al. ............ 257/782 |
| 5,569,620 | 10/1996 | Linn et al. ............ 437/62 |

FOREIGN PATENT DOCUMENTS

| | | |
|---|---|---|
| 0 109 082 | 5/1984 | European Pat. Off. |
| 95 30 8026 | 11/1997 | European Pat. Off. |

OTHER PUBLICATIONS

M. R. Poponiak and R. O. Schwenker, Enhanced Diffusion In Porous Silicon, Nov., 1974, vol. 17, No. 6.

S. Vaidya, E. N. Fuls and R. L. Johnston, NMOS Ring Oscillators with Cobalt–Silicided P–diffused Shallow Junctions Formed During the "Poly–Plug" Contact Doping Cycle, ED–33, Sep. 1986, No. 9.

Wolf, Silicon Processing, Lattice Press, vol. 2, 1990, pp. 498–500.

*Primary Examiner*—Valencia Martin-Wallace
*Attorney, Agent, or Firm*—Jaeckle Fleischmann & Mugel, LLP

[57] ABSTRACT

A buried silicide layer 111 in a bonded wafer 105 makes ohmic contact to a heavily doped buried layer 125. A dopant rapidly diffuses through the silicide layer and into the adjacent semiconductor to form the buried layer.

34 Claims, 15 Drawing Sheets

OHMIC CONTACT TO LIGHTLY DOPED ISLANDS FROM A CONDUCTIVE RAPID DIFFUSION BURIED LAYER

This is a division of application Ser. No. 08/336,768 filed on Nov. 9, 1994 now U.S. Pat. No. 5,643,821.

Use of suicides to make low resistivity buried layers is known (see U.S. Pat. No. 3,381,182 of C. G. Thornton for example). A limitation of most silicides is the fact that they form Schottky diodes with lightly doped (less than about $1 \times 10^{19}$ impurity ions per $cm^3$) N type silicon. This results in a Schottky diode in series with the silicide buried layer. The voltage loss due to the forward voltage drop of the diode defeats the improvement provided by the low resistivity of the silicide in many applications.

The Schottky diode can be eliminated by forming the silicide on a heavily doped (N+) region as Thornton does. The heavily doped (N+) region forms an ohmic contact with the silicide. The N+ region is undesirable in some applications because it can be quite thick, thus consuming valuable space. This is a particularly difficult problem when the island is to be subjected to a long diffusion after the heavily doped layer is in place because the dopants in the heavily doped layer will diffuse a long distance up into the island during the long diffusion. The island must be made very thick to accommodate this up diffusion.

An example of this is the formation of an island of second conductivity type (say P) from a region of first conductivity type (say N) by diffusion of appropriate impurities through the region from the front or back side. This is a known method for forming P and N type regions that are to be used for collectors of vertical PNPs and NPNs. A preferred method is to diffuse the collector up from the bottom of the finished island toward the surface into which the base will be formed and results in a collector doping profile in which the collector is most lightly doped where the base is formed and is most heavily doped farthest away from the base. This provides low base collector capacitance (due to low doping at the junction) and a partial buried layer (due to the higher doping remote from the base).

Formation of an up diffused collector region is often impossible when a heavily doped buried layer is already present because the two layers diffuse up together. It has been suggested to form the collector with a fast diffusing dopant such as boron and to form the buried layer with a slow diffusing dopant such as arsenic. However, even with such a technique it may not be possible to get the collector to diffuse enough farther than the buried layer to meet the space between base and buried layer needed for desired breakdown voltage. It is believed that the difference in dopant concentration levels compensates for the difference in diffusion rate of the different dopants so the desired spacing is not met.

An example of the prior art is the formation of P type islands and N type islands with buried layers in bonded wafers to be used as collectors for PNPs and NPNs. The structure 10 of FIG. 1 includes a handle wafer 11, a bonding oxide layer 12 and a device wafer 14. The device wafer 14 has an N-type epitaxial layer 16. An N-type island 9 is isolated from a P-type island 8 by an isolation trench 7 with a sidewall oxide layer 18 and a polysilicon filler 19. The structure 10 uses a conventional arsenic doped buried layer 17 and the P collector island 8 is formed by simultaneous up diffusion of a back collector diffusion 21 and down diffusion 20 of a front collector diffusion to limit the up diffusion of the N+ buried layer (FIG. 1). The use of two diffusions 20, 21 which meet in the center of the N epitaxial layer 16, reduces the diffusion time by about a factor of four because each P collector diffusion 20, 21 needs only go half the distance that a single diffusion from the bottom of the epi layer 16 would have to go to convert the entire epi layer 16 to P-type, and diffusion distance is proportional to the square root of diffusion time. Even with such a reduced collector diffusion time the N+ buried layer 17 may up diffuse about 7 to 10 microns into the epi layer 16 in a 40 V transistor process in which the thickness 22 of epitaxial layer 16 above the buried layer must be about 7 microns, thus doubling the required epitaxial thickness.

The PNP base is formed in the surface of the front P collector 20 where the doping-is relatively high. Doping of a diffused layer is highest at the surface from which the diffusion is made, typically obeying a Gaussian variation with distance from that surface. Consequently the base-collector capacitance, which is proportional to square root of collector doping, is relatively high.

SUMMARY

Thus a method of making silicide buried layers without forming the silicide on a heavily doped silicon layer is needed. The silicide must also make ohmic contact to N type silicon. The method should be compatible with diffusions that have large Dt (diffusion coefficient×diffusion time) products without requiring extra island thickness. Such a method is described below.

The structure and method of the invention relies upon the characteristic of some dopants for very rapidly diffusing in some suicides. Arsenic, phosphorus, antimony and boron are reported to diffuse 5 to 7 orders of magnitude faster in tungsten silicide than they do in silicon at the same temperature ("High Temperature Lateral Dopant Diffusion In $WSi_2$, $TiSi_2$ and TiN Films" by Francine Robb, Emily Thompson and Lewis Terry). This great a difference amounts to almost instant diffusion of these dopants through this silicide once they reach it.

The invention includes the steps of forming a silicide in contact with lightly doped silicon. Subsequent processing including all large Dt product diffusions (e.g. collectors) that would cause undue diffusion of a silicide contact layer are performed. Next a high concentration region of the same conductivity type as the island to which the silicide must make ohmic contact is formed to come into contact with some part of the silicide and is subjected to enough diffusion that the dopant of that region diffuses throughout the silicide and out of it into the adjacent silicon. The silicon adjacent to the silicide is doped to a high enough level by the dopant out diffusing from the silicide to make ohmic contact to the silicide. Further processing is performed to complete the device being made.

DRAWINGS

DETAILED DESCRIPTION

The First Embodiment

Figure 1:
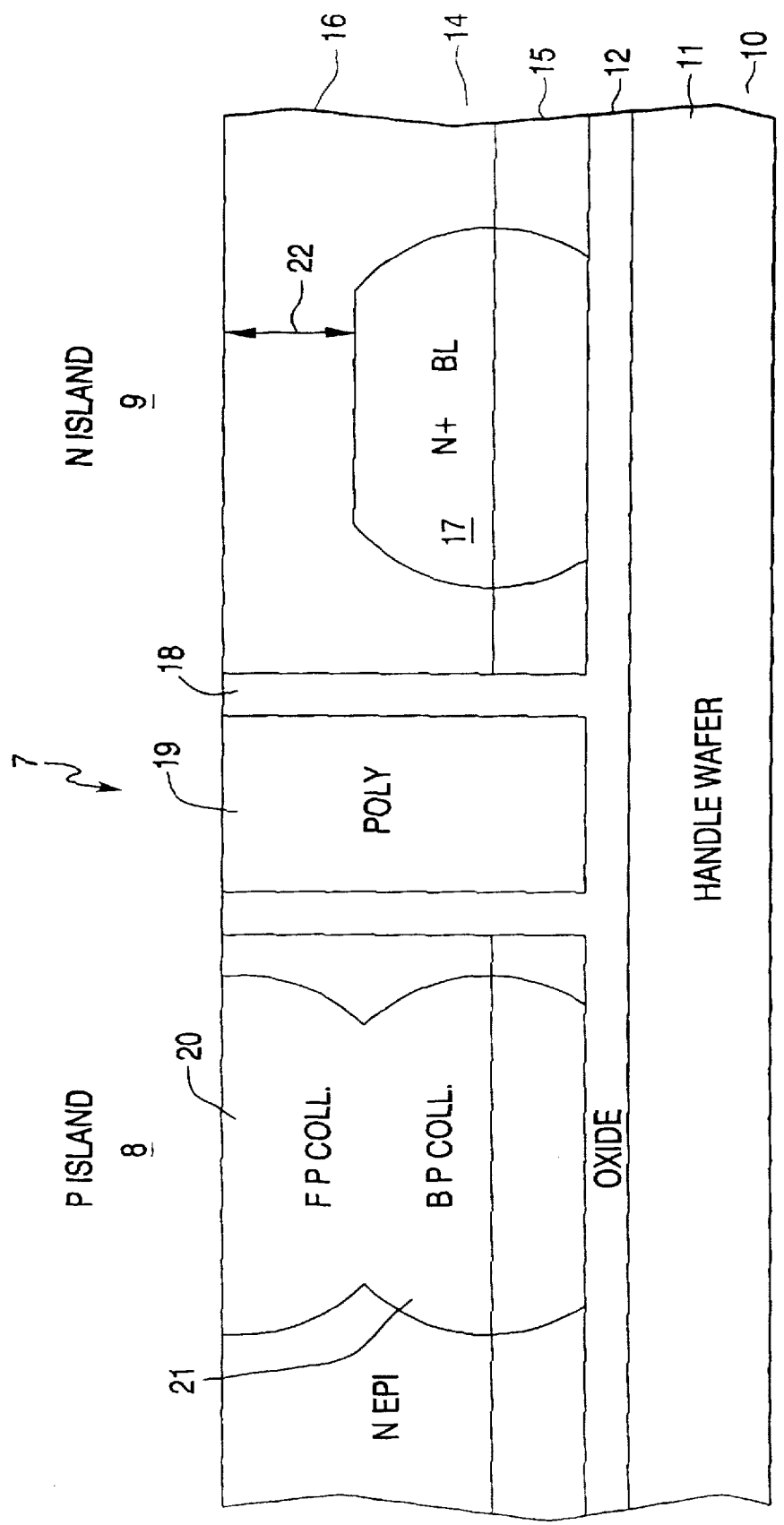
FIG. 1 is a prior art device.
Figure 2A:
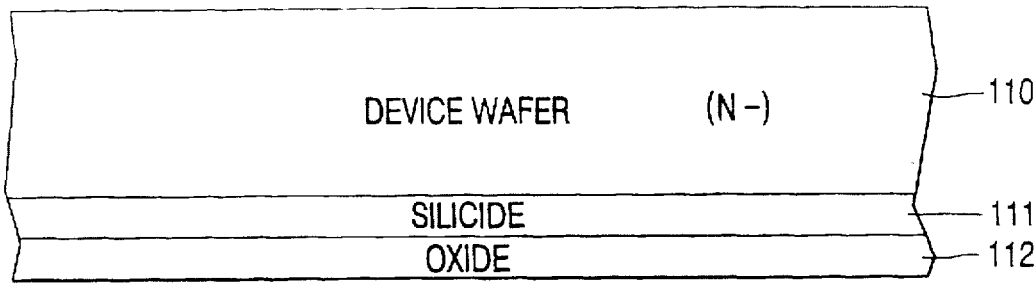
FIGS. 2a–2f show a series of steps to form a semiconductor device including a first embodiment of the invention.
Figure 2B:
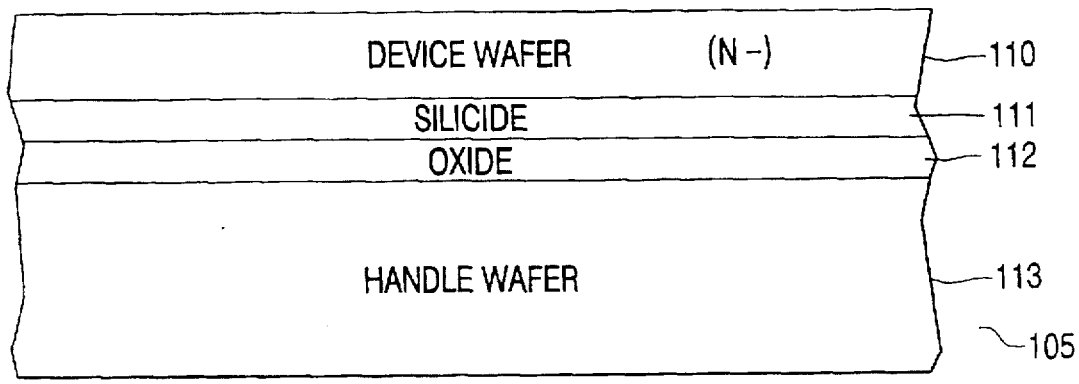
Figure 2C:
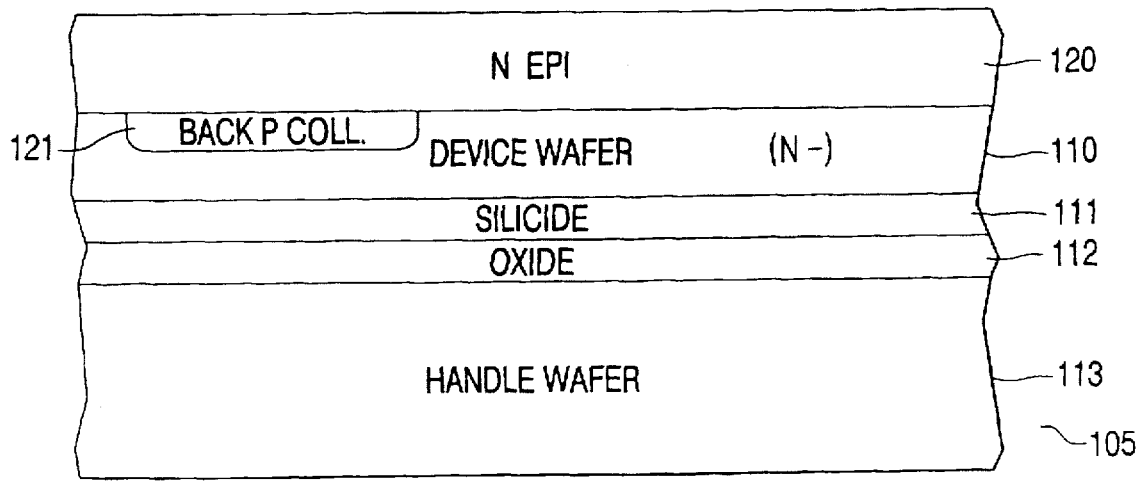
Figure 2D:
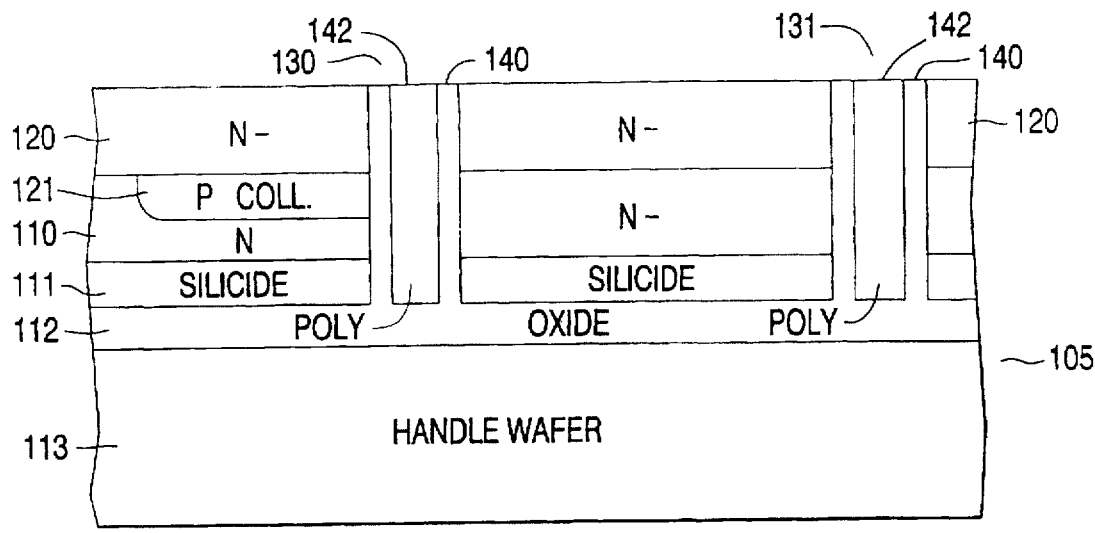
Figure 2E:
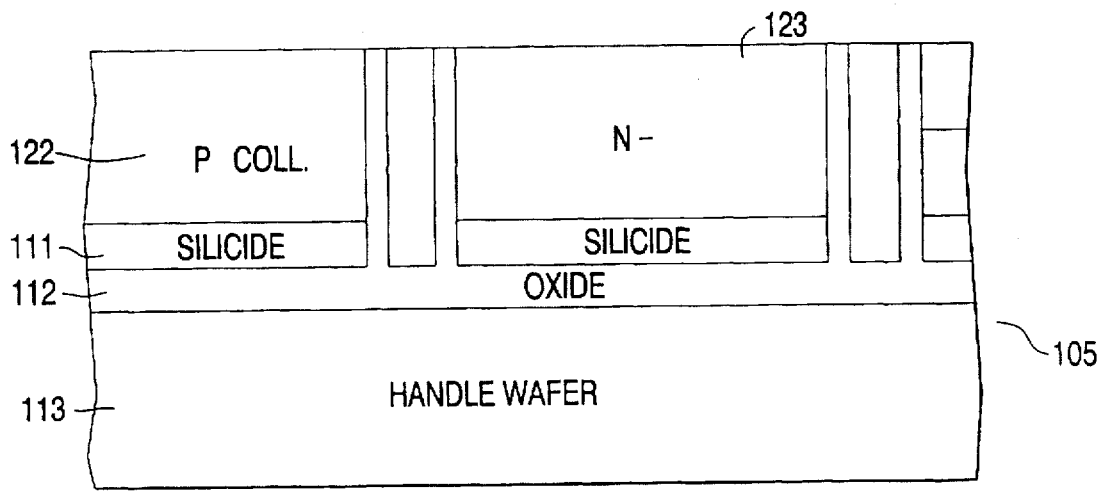
Figure 2F:
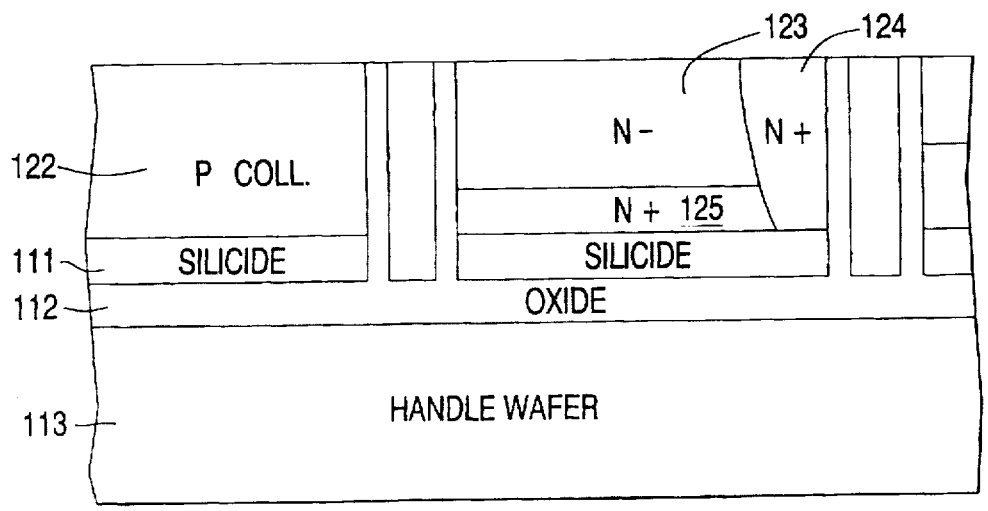

The problems of the prior art structure of FIG. 1 are overcome by using a silicide buried layer and ohmic contact diffusion. The process sequence is shown in FIG. 2. The process starts in FIG. 2a with a device wafer 110 on one side of which a silicide layer 111 is formed. An oxide layer 112, which will become the bottom isolation in a bonded wafer, is formed over the silicide 111. The oxide surface 112 is then bonded to a handle wafer 113 as shown in FIG. 2b to provide the bonded wafer 105. The device wafer 110 is thinned to a minimum thickness of about 2 microns; a back P collector region 121 is defined and doped and an N type epitaxial layer 120 is grown on the surface of the thinned device wafer 110 as shown in FIG. 2c. Next trenches 130, 131, etc. for lateral isolation are formed as shown in FIG. 2d. The trenches 130, 131 are coated with a sidewall oxide 140 and filled with polysilicon 142. The wafer 105 is then subject to a long high temperature diffusion (say 48 hours at 1250° C.) to drive the P collector 121 up through the N epi layer 120 to the front surface and provide the P collector 122 as shown in FIG. 2e. A deep N+ diffusion 124 is then patterned and diffused to reach the silicide buried layer 111. The diffusion 124 is continued long enough that the N+ reaches the silicide, diffuses laterally along it across the entire bottom of the island and up from the silicide into the adjacent island to form an N+ ohmic contact region 125 in the island 123 adjacent to the island silicide interface as shown in FIG. 2f. The process continues with conventional processing to form bases and emitters of the NPNs and PNPs and other desired structures.

A deep P+ diffusion in the P collector island 122 may be formed just before or after the deep N+ 124 and diffused at the same time as the N+. Such a deep P diffusion will provide the benefit of reduced resistance between island contact at the surface of the P island 122 and the silicide buried layer 111. It will also provide an ohmic layer between the lightly doped P island 122 and the silicide 111 if the silicide 111 does not make ohmic contact with lightly doped P type silicon 122. In addition, it provides a way to adjust the thickness of the lightly doped parts of the P and N islands to optimum values by adjusting the up diffusions of the P+ and N+ as necessary.

Figure 3A:
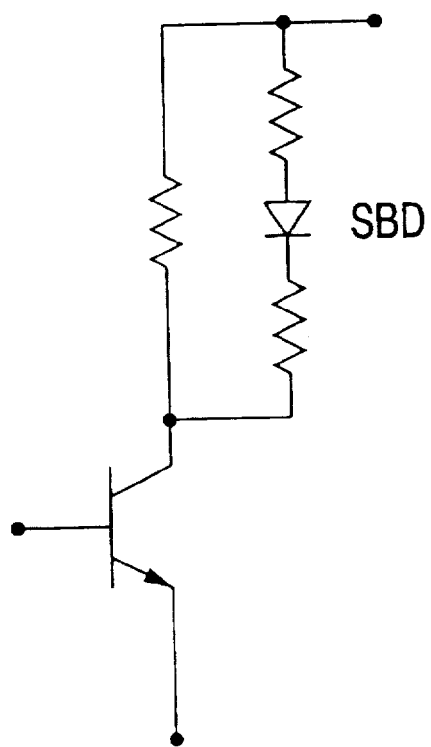
FIGS. 3a, 3b show a circuit schematic of two devices having the invention.
Figure 3B:
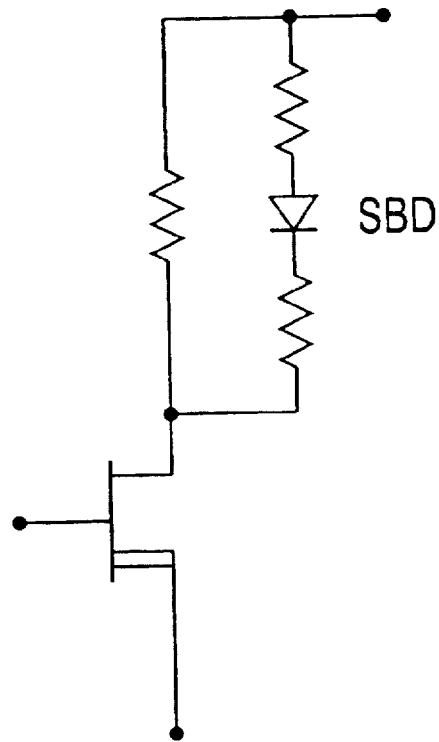

The deep N+ diffusion 124 can be omitted from selected N type islands. The silicide in those islands will form a Schottky diode with the island. The effect of this is that the diode will be in series with the buried layer. The diode will be shunted by the resistance of the N island. The result is modeled as shown in FIG. 3 for quasi vertical DMOS and vertical NPN devices whose drain and collector respectively are the N island. The series resistance is still reduced from that of the island itself by the silicide but a SBD diode voltage drop is present in the buried layer path. This structure may be preferred in some cases where resistance is low enough and area can be saved by omitting the deep N+.

A similar process can be used to reduce buried layer up diffusion when only a front collector is used. The process sequence can be similar to that illustrated in FIGS. 2a–2f except the P collector is patterned and diffused from the epi surface before or after the formation of the trench isolation.

The process also works when the diffused collector is N type rather than P type. For example a P type epitaxial layer can be grown over a back N collector and a deep N+ diffused down to the silicide below it to form an ohmic contact between them after the N collector has been up diffused through the epi layer.

The ohmic silicide buried layer can be implemented in material other than bonded wafers. The front collector only example given above could be made in conventional dielectric isolation (DI) material of either of the types described in Thornton.

Another variation is using the known method (Robb et al.) of bonding a silicide coated-wafer (N) to a second wafer such that the second wafer (P) type becomes a substrate below the N wafer, which is thinned to become a device wafer, which is PN junction isolated from the substrate. Lateral isolation in this case could be by trenches or by lateral PN junctions. This structure would eliminate the thermal resistance of the bottom isolation oxide in the conventional bonded wafer process.

Those skilled in the art will understand that silicide layer 111 and oxide layer 112 could be formed on the handle wafer 113. It is also possible for both wafers 110 and 113 to have silicide layers that are-bonded together. The structure of FIG. 2 could also be made by forming oxide and silicide layers on the handle wafer 113 before bonding the handle wafer 113 to device wafer 110.

The Second Embodiment

Figure 4A:
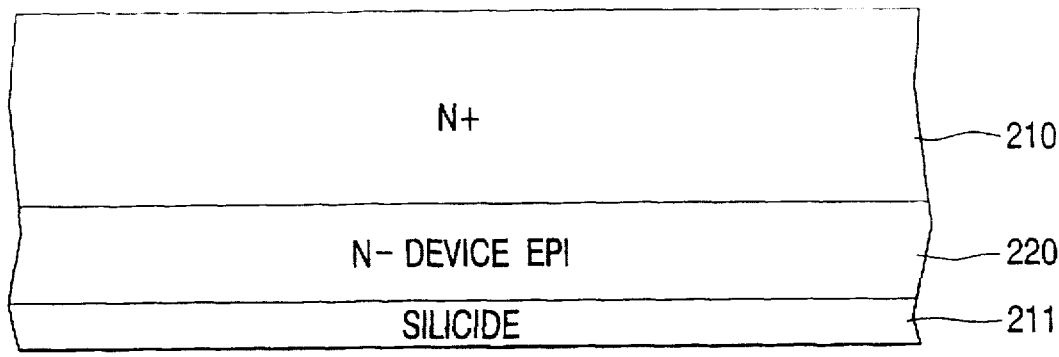
FIGS. 4a–4e show a series of steps to form a semiconductor device including a second embodiment of the invention.
Figure 4B:
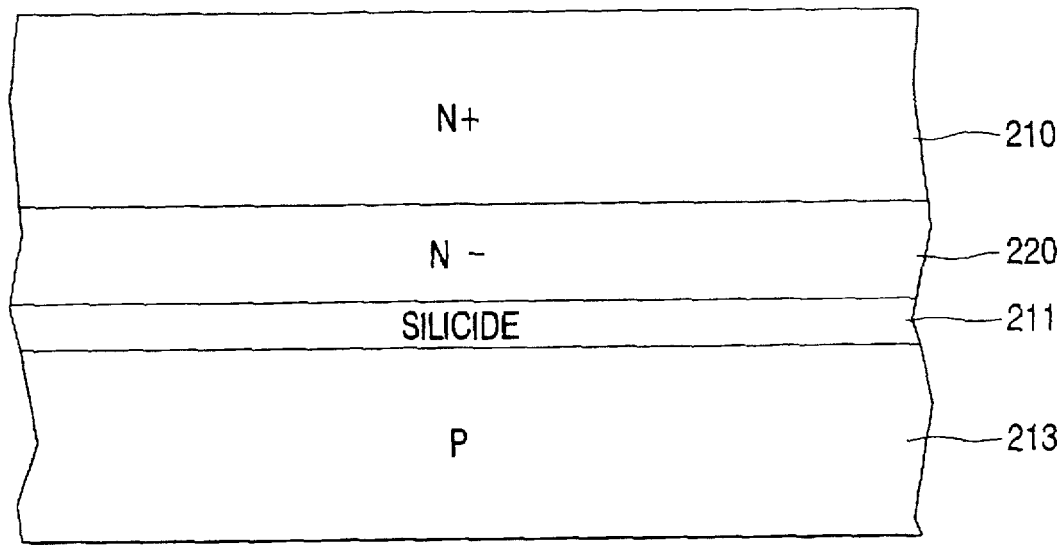
Figure 4C:
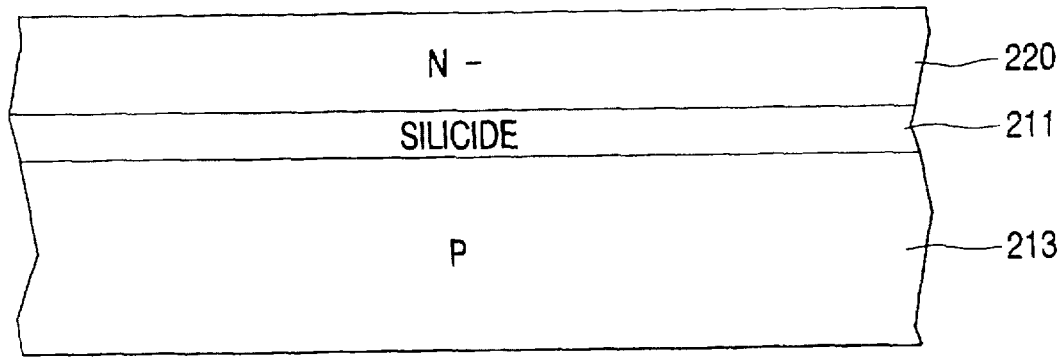
Figure 4D:
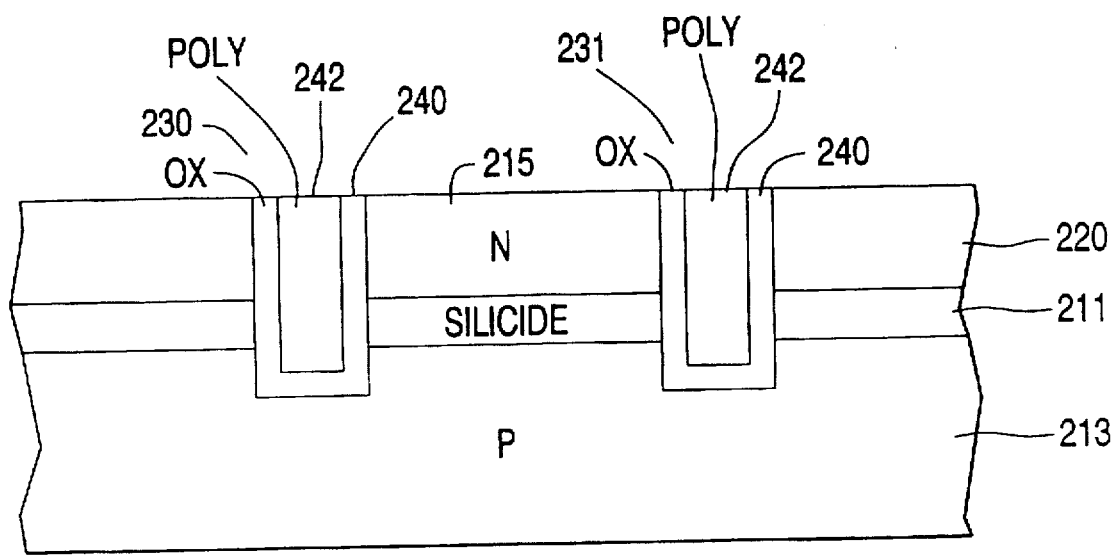
Figure 4E:
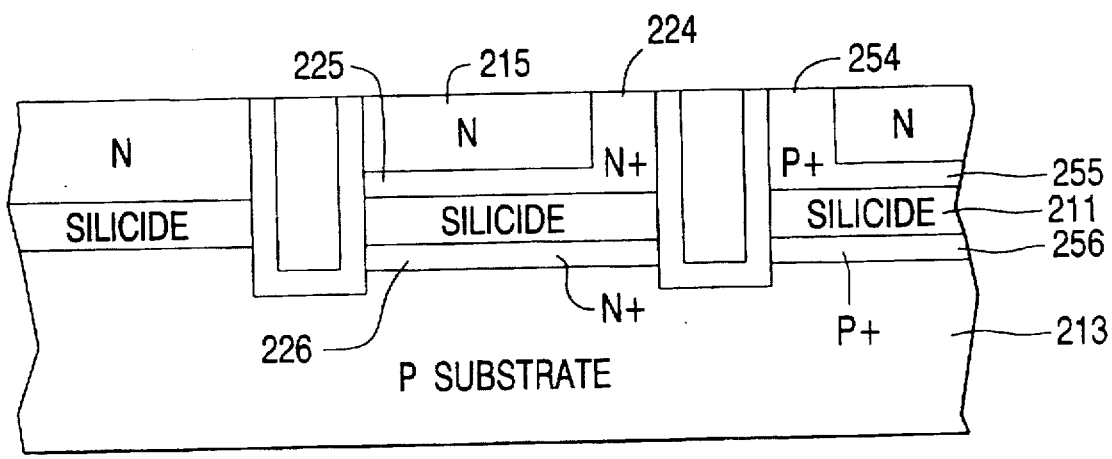

An example of the junction bottom isolation structure with silicide buried layer is illustrated in FIGS. 4a–4e. The process starts with an N+ device wafer 210 shown with optional N epitaxial layer 220 for precise N island thickness control, and on which a silicide 211 is formed. The silicide 211 is bonded to a P type handle wafer 213 which will become the substrate of the finished circuit. FIG. 4b. The N+ wafer 210 is removed using the known grind and electrochemical etch process that selectively removes the N+ while leaving the lighter doped N epi layer 220 as shown in FIG. 4c. Trenches 230, 231, etc. are then patterned and formed to provide lateral isolation as shown in FIG. 4d. The trenches 230, 231 are coated with a sidewall oxide 240 and filled with polysilicon 242 or other suitable material. Next any long diffusion cycles are performed after which a deep N+ diffusion 224 is patterned and diffused down to the silicide 211, laterally through it across the entire island and up and down into the adjacent island and substrate regions to form N+ layers 225, 226 as shown in FIG. 4e. As in FIG. 3, additional processing not shown is used to complete fabrication of the desired devices.

The up diffused N+ layer 225 provides ohmic contact between the N island 215 and the silicide 211. The down diffused N+ layer 226 forms ohmic contact to the silicide 211 and thus is an ohmic extension of the island. It also forms a PN junction with the P type substrate. That junction is the bottom isolation for the island 215.

An optional deep P+ diffusion 254 is also shown in FIG. 4e. The diffusion 254 is used to make ohmic contact to the silicide 211 and through it to the P+ layer 256 in ohmic contact with substrate 213 to provide a top surface contact to the substrate 213 by which the substrate 213 can be biased. A substrate bias is required to reverse bias all substrate to N+ under N island junctions to provide the bottom isolation.

The Third Embodiment

Figure 5:
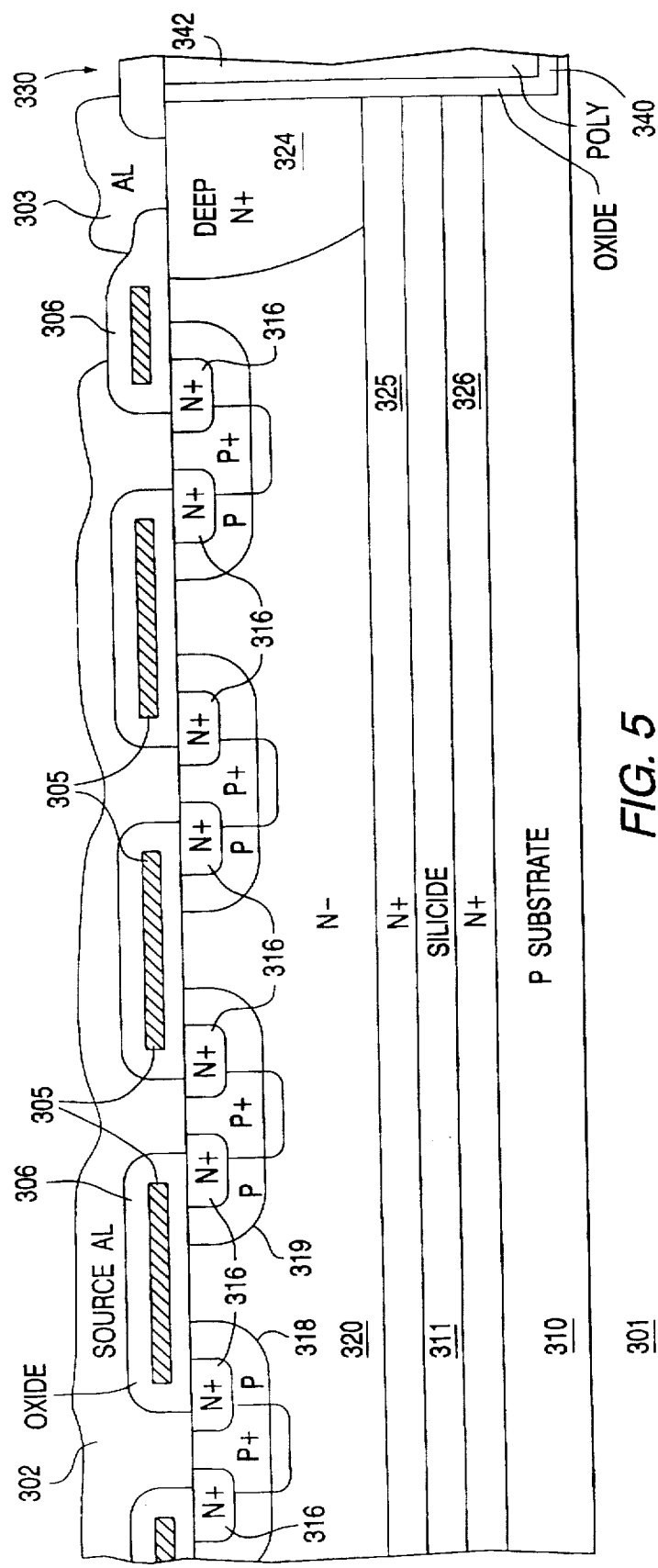
FIG. 5 shows a third embodiment of the invention.

One application of such islands is a power BICMOS process, which has high current quasi vertical DMOS device 301 as shown in FIG. 5. The current flow in the DMOS 301 is from drain contact 303 through deep N+ diffusion 324 to buried layer 325, laterally along the buried layer 325, up through the N– island 320, through the N-region between the adjacent P regions 318, 319 (the body) along the surface of the P body in an inversion layer channel induced by the voltage on the gate 305, into the N+ source 316 and out the source conductor 302, typically aluminum. Most of the resistance in this path comes from the N– region 320 followed by the buried layer resistance. These resistances are minimized by minimizing the N– layer 320 thickness subject to a device breakdown constraint and by minimizing the buried layer resistivity. The buried layer resistivity is minimized by using the silicide buried layer 311, which can reduce buried layer resistivity by more than a factor of 10 compared to that of an N+ diffusion.

A long diffusion, which might be done before the deep N+ diffusion 324 in this process, is the CMOS well diffusion. A BICMOS process could also be made in the material of FIGS. 4a–4e.

The Fourth Embodiment

One of the features of the silicide buried layer JI (junction isolation) bottom isolation structure of FIG. 4e is that no minority carrier generated within its islands can reach the substrate 213. The oxide isolation 240 on the side walls blocks all carrier flow through them. The silicide layer 211 that fills the bottom of the island 215 extends into contact with the side isolation oxide 240 at its perimeter and acts as an infinite recombination site. As such, all minority carriers that reach silicide layer 211 recombine there. Thus there is no path out of the island through which minority carriers can flow.

The total containment of minority carriers makes these islands ideal for isolating devices such as saturating bipolar transistors, IGBTs (insulated gated bipolar transistor), MCTs (MOS controlled thyristors) and SCRs, whose operation results in high concentrations of minority carriers in the island. The use of these devices is often limited to full DI isolation because minority carrier escape to the substrate causes unacceptable parasitic action in JI bottom isolation structures The FIG. 4e islands allow the use of these devices without parasitic action while retaining the low thermal resistance of JI.

Figure 6:
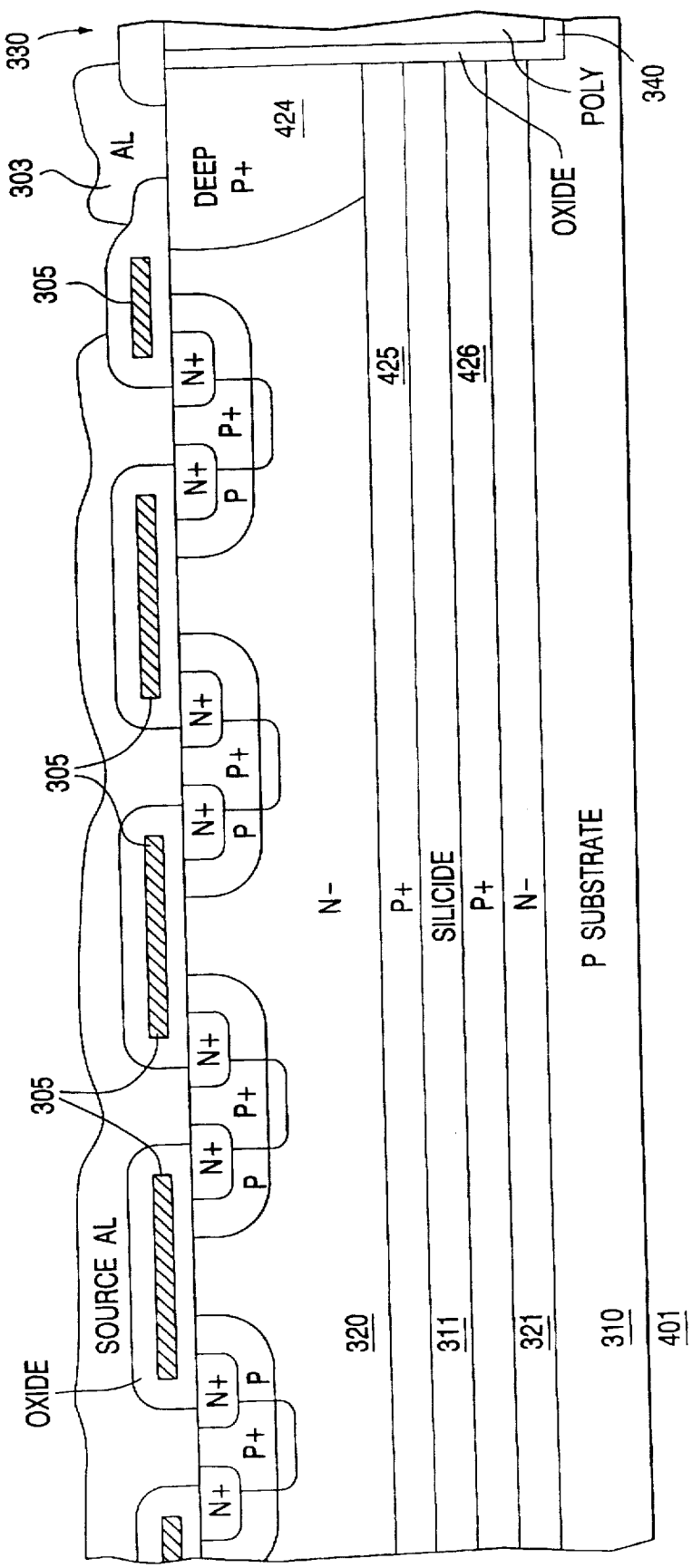
FIG. 6 shows a fourth embodiment of the invention.

An example of a quasi vertical IGBT 401 is shown in FIG. 6. Note the similarity of IGBT 401 to the DMOS 301 of FIG. 5. The deep N+ diffusion 324 is replaced by a deep P+ diffusion 424, which creates a P+ layer 425 at the bottom of the island. The P+ layer 425 is the anode. A P+ layer 426 also forms beneath the silicide layer 311. Layer 426 has the undesirable effect of making ohmic contact to the P type 310 substrate, thus defeating bottom isolation. This problem is overcome by diffusing a low doped N type layer 321 down to the silicide 311 before the P+ diffusion 424. The N diffusion spreads across the silicide 311 and down into the adjacent P substrate 310. The N diffusion diffuses further than the P+ layer 426 into the substrate 310 so that a residual N layer 321 remains between the P+ and the P substrate. This N layer 321 forms the isolation junction with the P substrate 310.

The Fifth Embodiment

Complementary P and N type islands can also be made using PN junction isolation under a silicide buried layer in a structure similar to that of FIG. 5. The combination of dielectric coated trench lateral isolation with a bottom silicide layer prevents minority carriers from flowing between island and substrate as explained previously thus eliminating parasitic SCR devices that occur in prior art junction isolated complementary island structures. Thermal resistance will be lower than in similar sized bonded wafer islands due to the elimination of the layer of isolation oxide with its high (relative to silicon) thermal resistivity. The process sequence illustrated for the case of a back diffused P collector (similar to the bonded wafer process of FIG. 2) is shown in FIGS. 7a–7e.

Figure 7A:
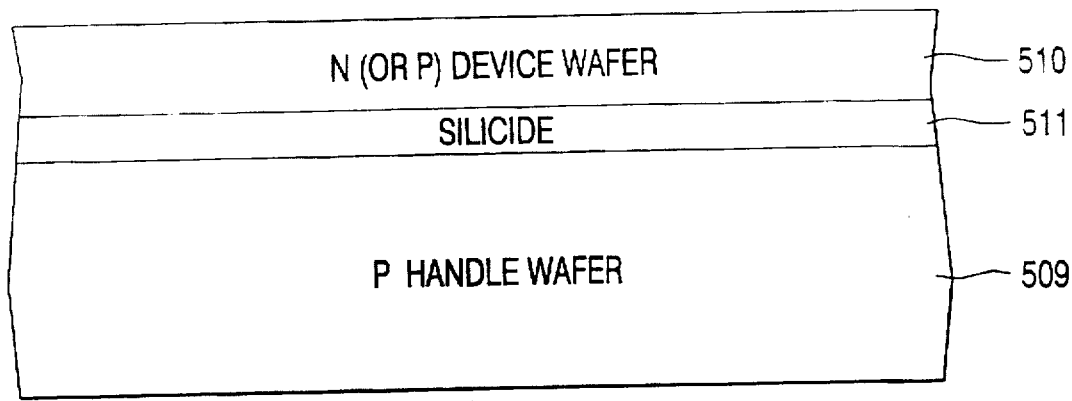
FIGS. 7a–7e show a series of steps to form a semiconductor device including a fifth embodiment of the invention.

The process starts as shown in FIG. 7a with the steps of forming a silicide 511 on the surface of a device wafer 510 and bonding the silicide surface 511 to a handle wafer (substrate) 509. The device wafer 510 is then thinned to minimum thickness (about 2 microns) for which a usable minimum thickness can be assured given process tolerances. The handle wafer 509 doping type is chosen to form PN junctions with the out diffused regions of the overlying islands that form in its surface during processing. P type is preferred and is illustrated. The device wafer 510 may be either N or P type; N type is preferred for use with P type substrates because of the simpler P island isolation region formation process described below.

An N type isolation region 520 is formed in the substrate 509 under islands in which P type layers come into contact with the silicide buried layer as was described in the discussion of FIG. 6. The PN junction provides isolation between the P type region formed in the surface of the substrate where P type dopants out diffuse from the silicide layer and the P type substrate.

Figure 7B:
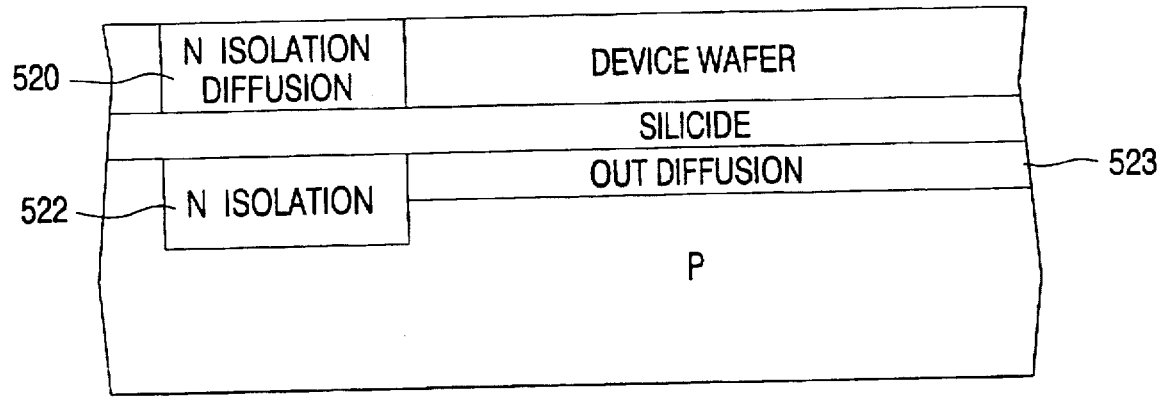

The isolation regions 520, 522 can be formed in several different ways. The simplest method is to use an N type device wafer and diffuse N type dopants from it through the silicide layer into the substrate for the desired distance before and or directly after it is thinned. It is also possible to pattern a region requiring N isolation on the surface of the thinned device wafer and introduce and diffuse the desired dopants through the device wafer and silicide and into the substrate. The dopants will tend to diffuse laterally through the silicide, e.g. layer 523, and out diffuse equally into all parts of the substrate unless the silicide 511 is $TiSi_2$ in which case a dopant with a low diffusion coefficient is used. Another method is to form the N isolation layer 522 in the surface of the P type substrate 509 (handle wafer) by a nonselective diffusion before it is bonded to the silicided surface 511 of the device wafer 510. The case of a masked isolation that does not diffuse laterally through the silicide is illustrated in FIG. 7b which also shows an out diffused layer 523 from the nonpatterned part of the device wafer.

Figure 7C:
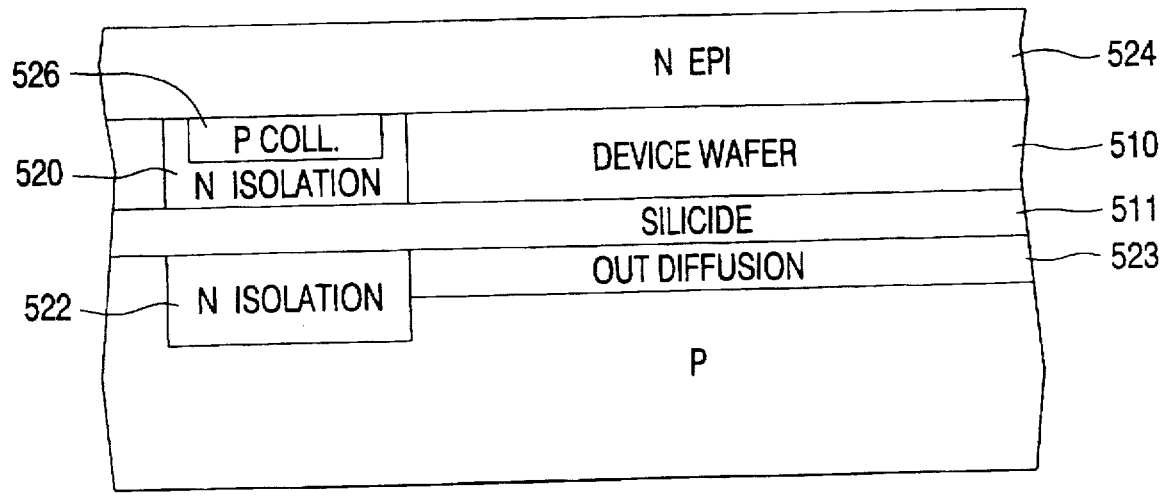
Figure 7D:
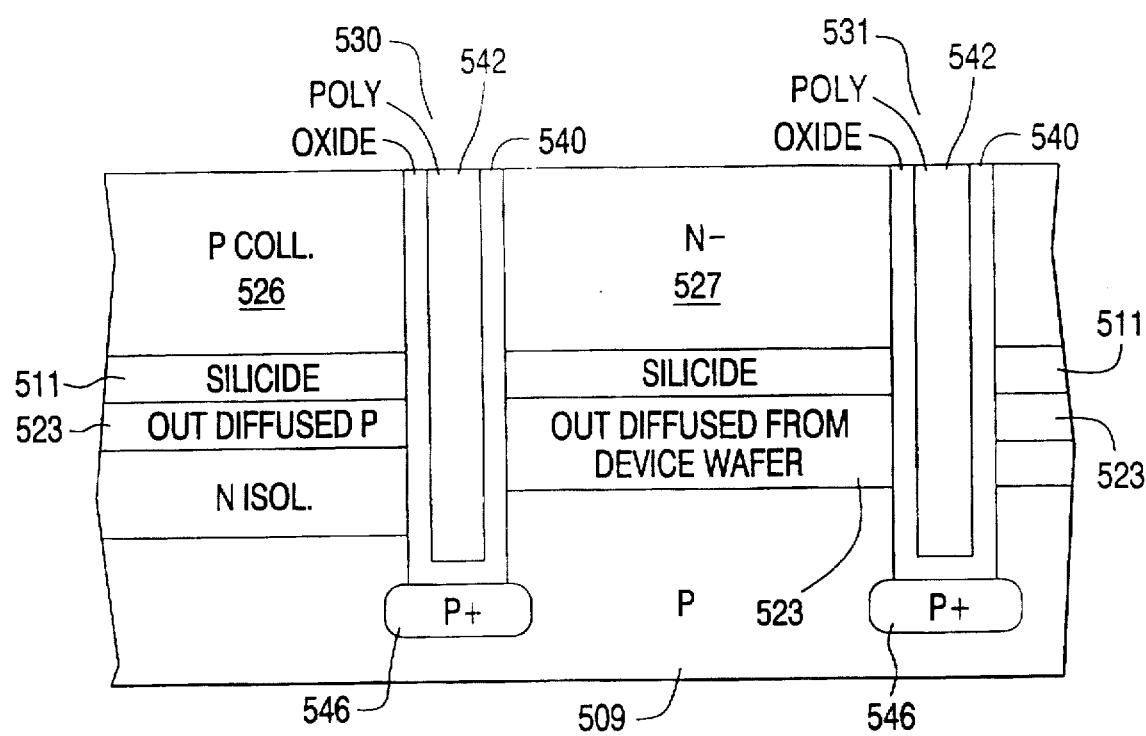
Figure 7E:
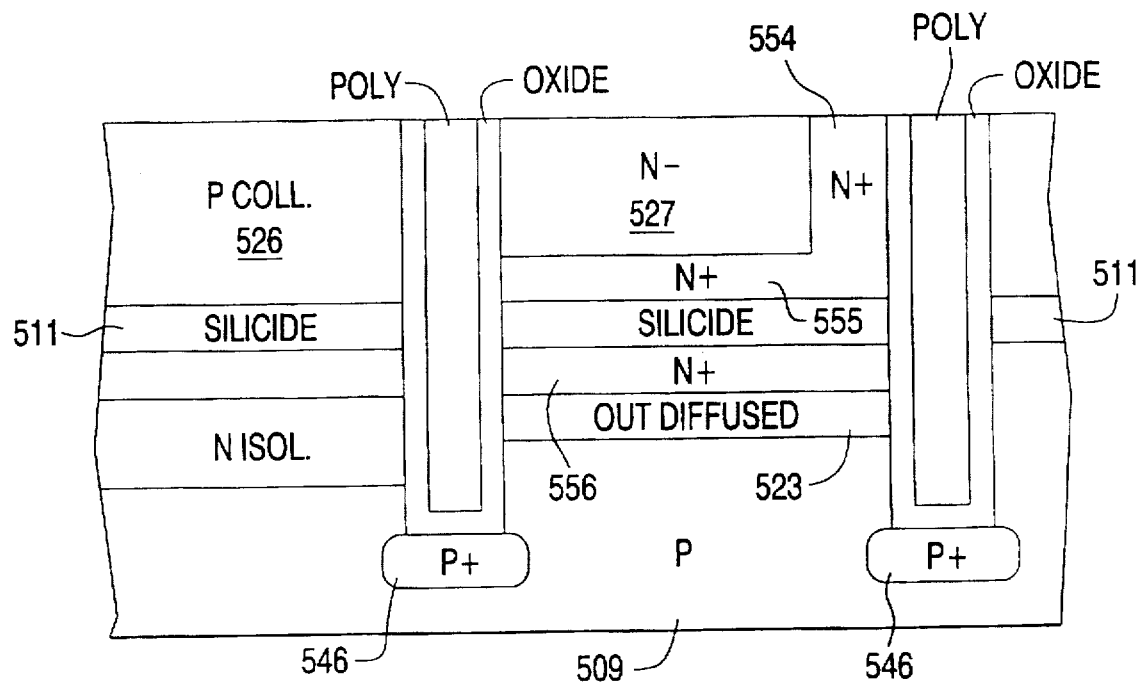

As shown in FIG. 7c, a P type collector 526 is patterned and doped after the isolation layer 520 is formed. Then an epitaxial layer 524 is grown on the surface of the device wafer 510. Trenches 530, 531, etc. are defined at a later step in the process flow to provide lateral isolation. As shown in FIG. 7d the trenches 530, 531 have sidewall oxides 540 and are filled with suitable material, such as polysilicon 542. A preferred point in the flow to form the trenches, at least in the case where the collector is thicker than the trenches are wide, is before the collector is diffused. The presence of the trenches 530, 531 prevents the collector 526 from diffusing laterally into the adjacent island 527 as it could do if the trenches 530, 531 were not present to block them. The lateral diffusion distance is 0.6 to 0.8 times the vertical diffusion distance depending on the doping level.

It may be desirable to form P+ channel stops 546 below the bottoms of the trenches 530, 531 to prevent parasitic MOS action between bottoms of adjacent islands. When stops 546 are used and the trenches 530, 531 are formed before collector diffusion, one may choose to pattern and etch the trenches 530, 531, diffuse the P collector 526 and then form the P+ channel stops 546. The channel stops 546 are preferably formed by ion implant using the trench pattern as mask. After formation, the trenches 530, 531 are coated with a sidewall oxide 540 and filled with a material 542, preferably polysilicon. This sequence avoids subjecting the channel stops 546 to the collector diffusion thus minimizing the distance the channel stop diffusion diffuses laterally, thereby saving space and allowing the device to be smaller. The structure after collector diffusion 526 and trench formation is illustrated in FIG. 7d.

The N type islands 527 can be made to have ohmic contact with the buried silicide layer 511 by diffusing a deep N+ layer 554 down to the silicide 511, laterally through it and up and down into the adjacent N island and substrate to form layers 555 and 556. The deep N+ diffusion 554 can be omitted from any islands that are underlain by N isolation regions if ohmic contact is not required to the silicide buried layer 511. Since The N layer 523 provides the isolation otherwise provided by the down diffused N layers 555, 556 from the deep N+ diffusion 554 can be omitted. Omission of the deep N+ diffusion 554 saves space because no area need be allowed for the space it occupies including the area into which it side diffuses.

Processes that require only N type islands can be made with junction isolated silicide buried layers using any of the N isolation methods described above. Deep N+ diffusions can be used to make ohmic contact to the buried layers of selected islands. In applications where ohmic contact is not required to any island, the deep N+ process steps may be omitted.

The Sixth Embodiment

An alternative method of introducing the dopant into the silicide layer is illustrated in FIGS. 8a–8e. Also illustrated is use of a method for achieving epitaxial thickness control of the layer of silicon above the silicide in which the devices are formed.

Figure 8A:
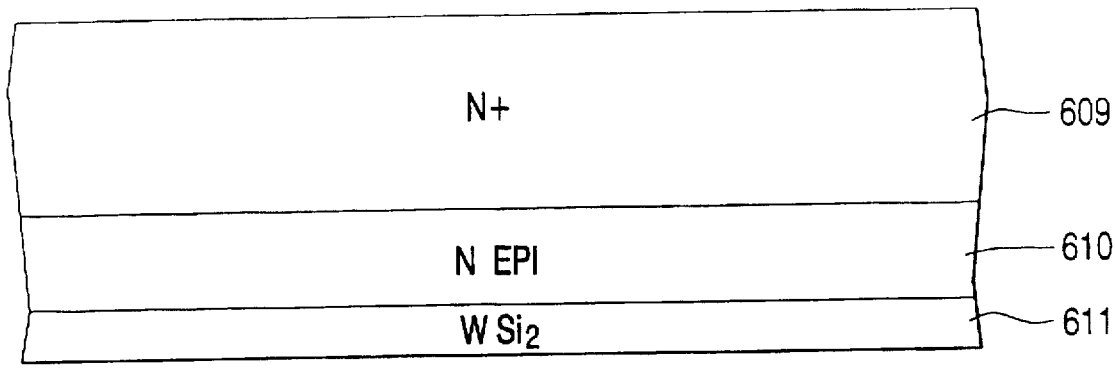
FIGS. 8a–8e show a series of steps to form a semiconductor device including a sixth embodiment of the invention.
Figure 8B:
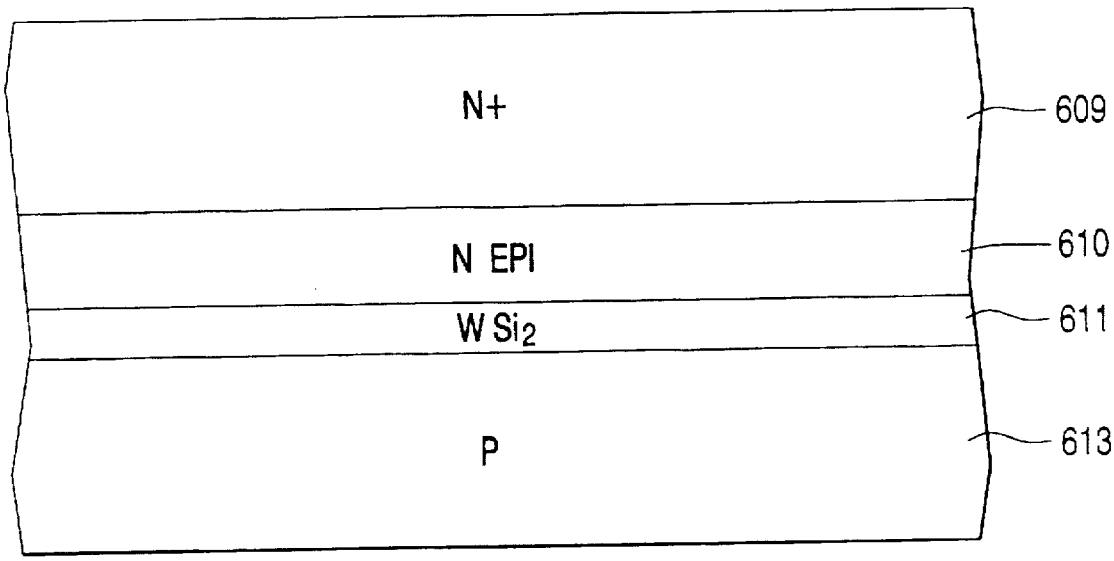
Figure 8C:
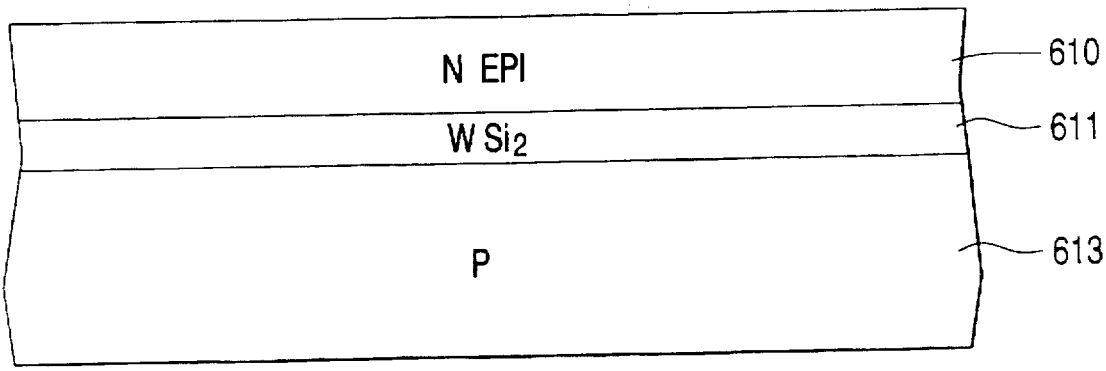

The process starts with an N+ wafer 609 on which an N type epitaxial layer 610 is grown and in which layer 610 semiconductor devices will be built. A silicide layer 611 is formed on the surface of epitaxial layer 610. Next a P-type substrate 613 is bonded to the silicide layer 611 as shown in FIG. 8b. After bonding, the N+ wafer 609 is removed using the known process in which wafer 609 is thinned by mechanical grinding and polishing and final removal by an electrochemical etch, which selectively removes N+ silicon while not etching the lightly doped silicon of the epitaxial layer 610. The N epitaxial layer 610 is thus left as device side silicon above, the silicide 611 as shown in FIG. 8c. The device layer 610 thickness is controlled by the epitaxial deposition, which provides more precise control than the grinding and polishing of a device wafer to a chosen thickness.

Figure 8D:
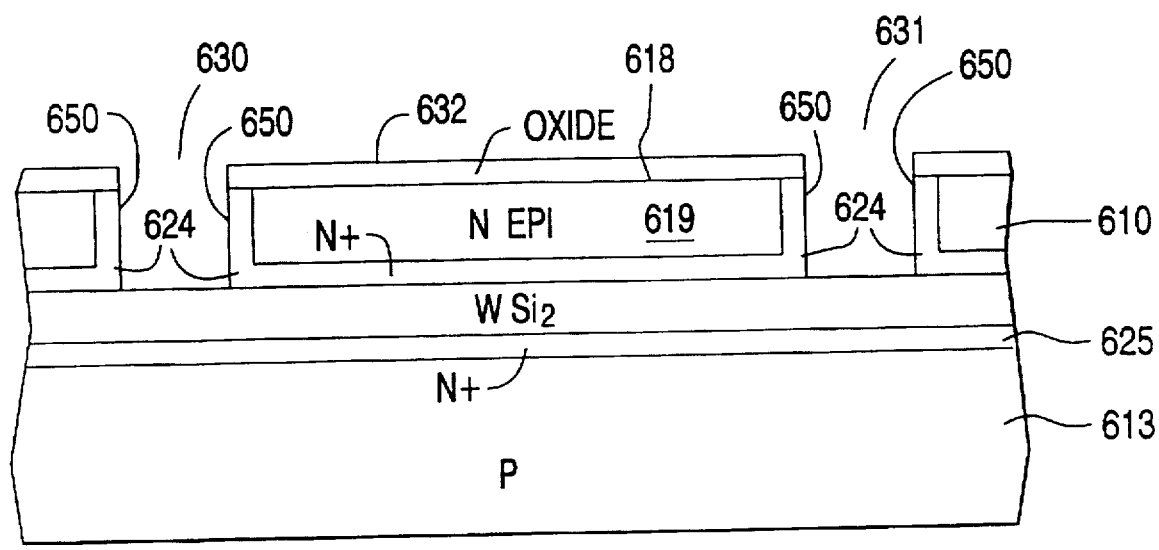
Figure 8E:
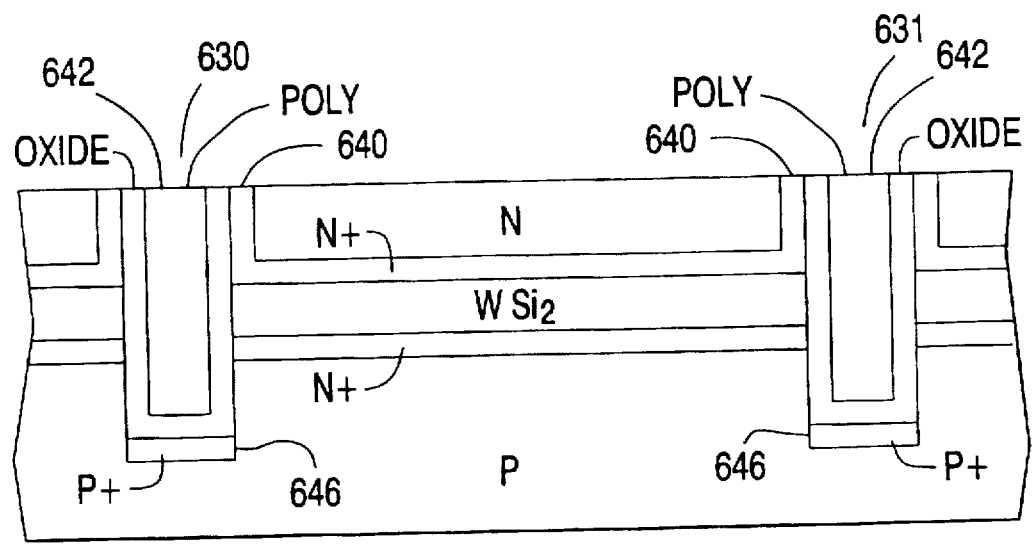
Figure 9A:
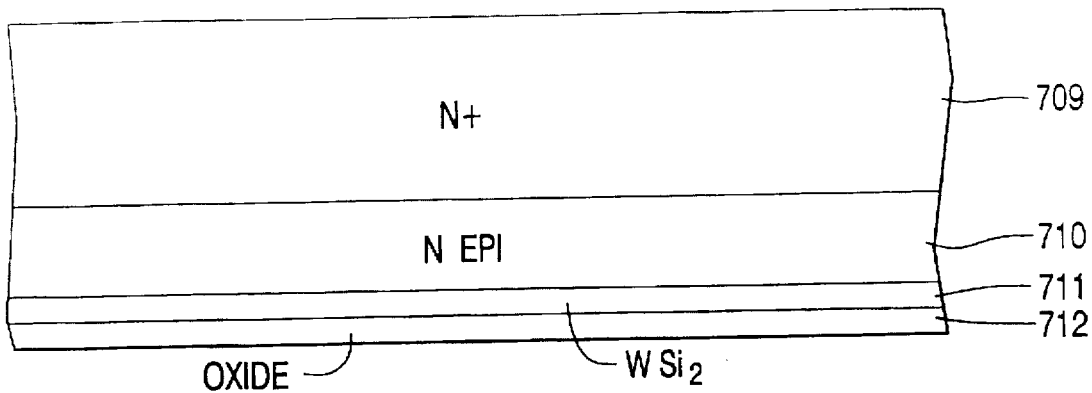
FIGS. 9a–9e show a series of steps to form a semiconductor device including a seventh embodiment of the invention.
Figure 9B:
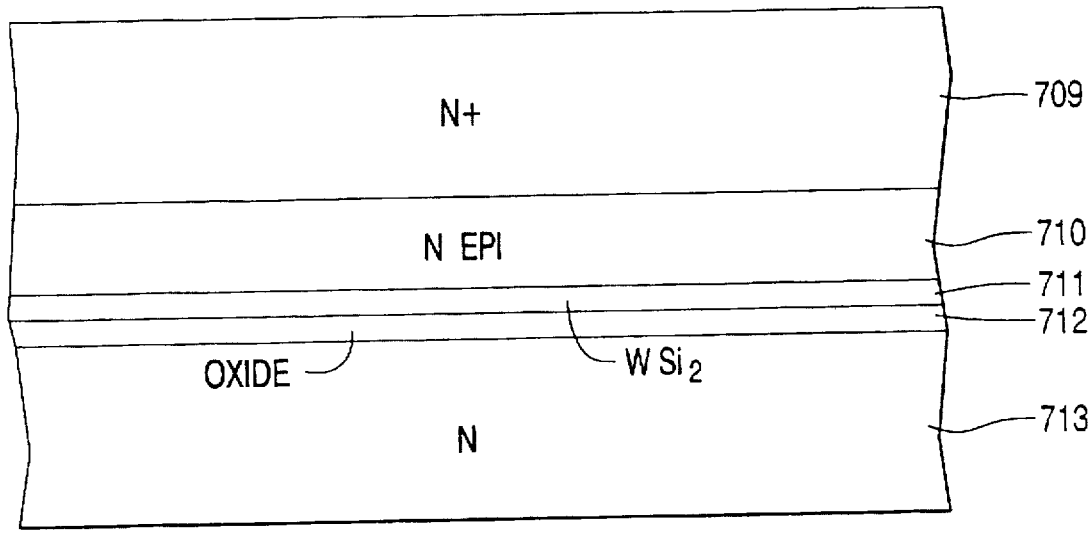
Figure 9C:
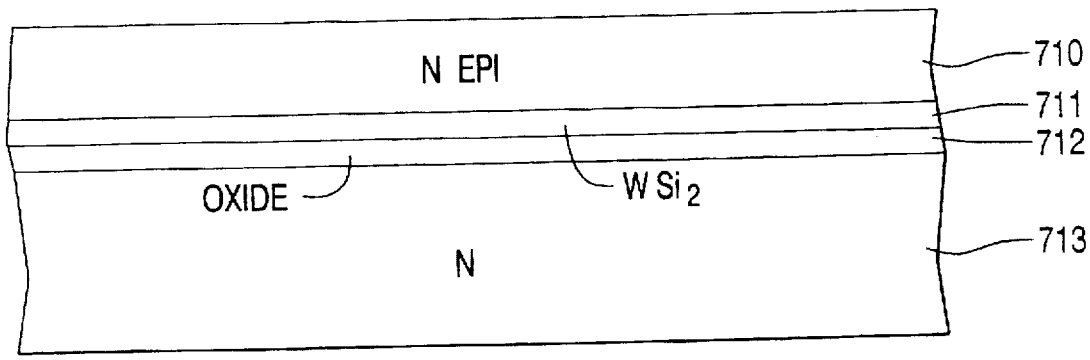
Figure 9D:
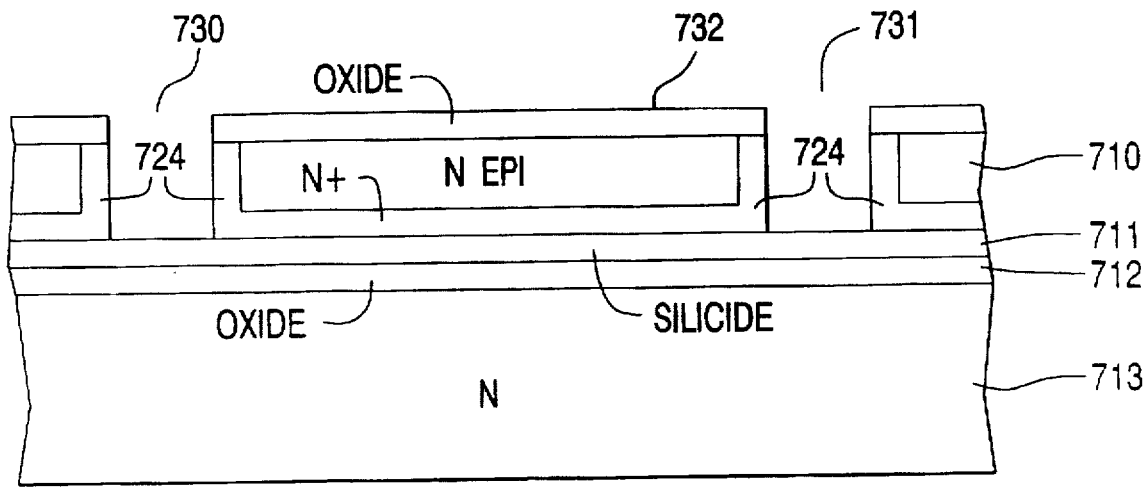
Figure 9E:
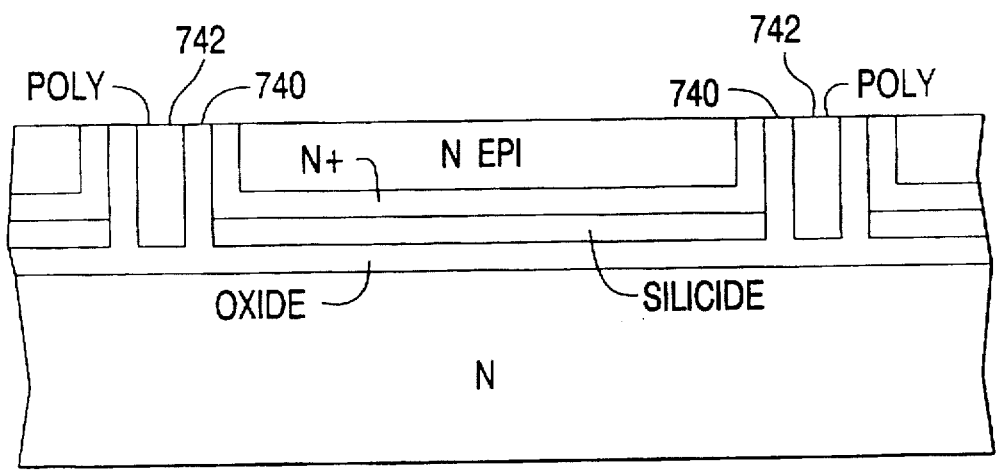

With reference to FIG. 8d, trenches 630, 631, etc. are etched to expose the silicide layer 611. In the preferred method, the silicide layer 611 acts as an etch stop for the trench etchant. After trench etch, a heavily doped N+ diffusion is made into the trench openings 630, 631 while the surface of layer 610 is masked with an oxide mask 632. The N+ diffusion may be made using any one of a number of known techniques, including open tube deposition or diffusion from an oxide source deposited on the trenches 630, 631. In this way the sides of the islands 619 (which are the trench walls 650) are doped N+ providing a deep contact between the silicide buried layer 611 and the island surface 618. The N+ dopant is also introduced directly into the silicide rather than having to diffuse through the entire thickness of the overlying island to reach it as in FIG. 1 for instance. This makes it possible to introduce a large amount of dopant into the silicide 611 to diffuse through it and out into the adjacent island 619 above and substrate 613 below with a short diffusion Dt product. The out diffused dopant forms layers 624 and 625 in the respective epitaxial layers 610 and substrate 613.

After doping with N+, the trenches 630, 631 are etched through the silicide layer 611 and into the substrate 613 deeper than the N+ out diffused layer 625 from the silicide 611. P+ channel stops 646 are optionally formed at the bottom of the trenches 630, 631 and an oxide isolation layer 640 is formed on the surface of the trench by a suitable method such as chemical vapor deposition and the trenches 630, 631 are filled with polysilicon 642 to complete the isolation process.

An option that can be used with the above process is to form a silicide layer on the sides of the trenches before or after the N+ doping step. The side silicide provides a lower resistance path from the buried layer to the surface than does the N+ diffusion and thus complements the resistance reduction provided by the silicide buried layer.

The Seventh Embodiment

A similar flow for full dielectric isolation in which the trenches are etched before N+ doping is illustrated in FIGS. 9a–9e. One difference is that an oxide layer 712 is deposited on the silicide layer 711. Note also that the silicide 711 in the bottoms of the trenches 730, 731, etc. is completely etched out of the bottoms of the trenches after N+ diffusion 742. Otherwise silicide in the trench bottoms would form a short circuit between adjacent islands.

The Eight Embodiment

Figure 10:
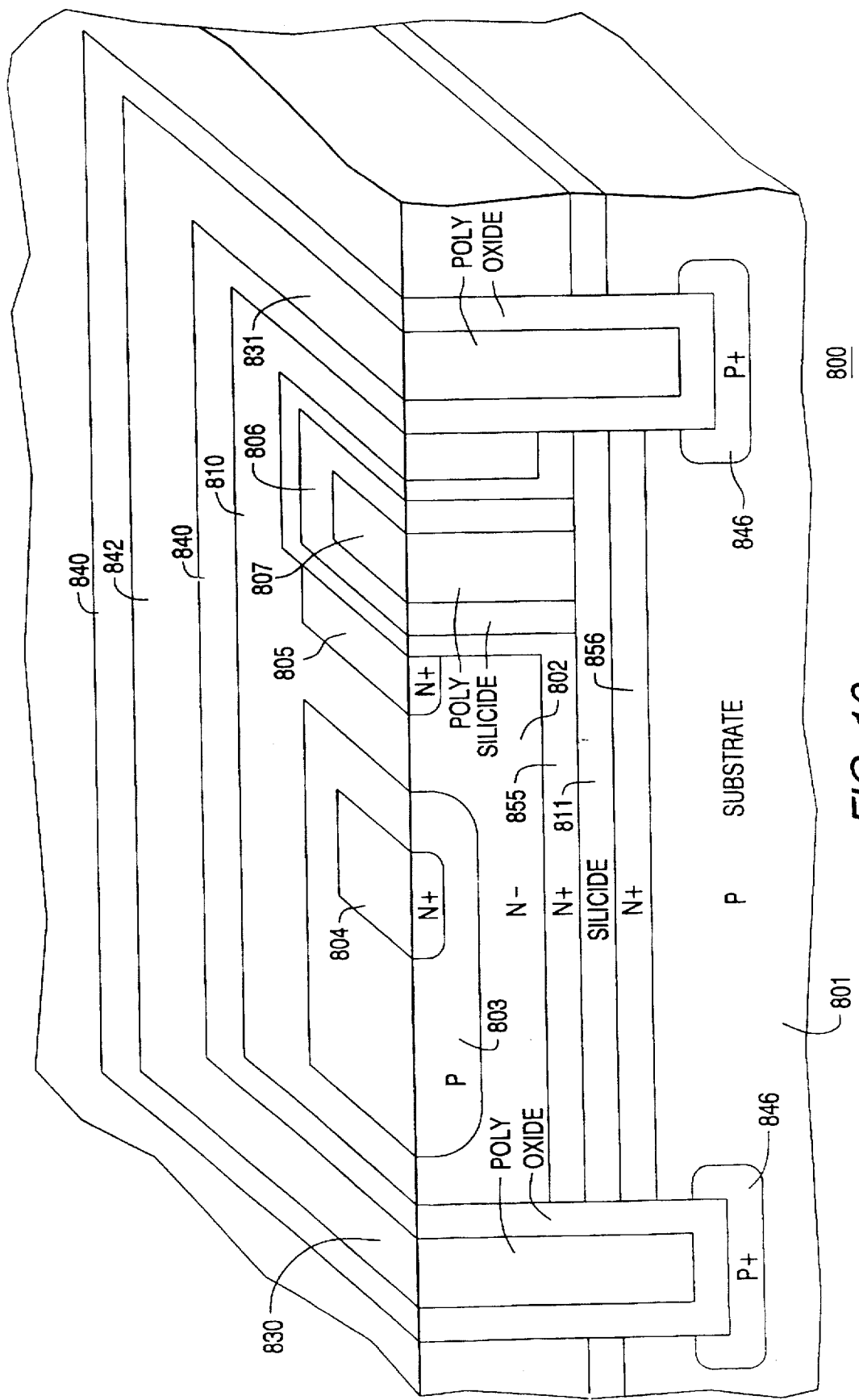
FIG. 10 shows an eight embodiment of the invention.

With reference to FIG. 10, there is shown another method of introducing the dopant to the silicide and simultaneously forming a deep contact that provides a low resistance path between the silicide buried layer 811 and the island surface. A surface contact trench 810 is not connected to the isolation trenches 830, 831 and extends from the surface of device 800 down to about the depth of the buried silicide layer 811. The contact trench 810 is formed at a chosen point in the process sequence. Dopant 855 (N+ in the FIG. 10 example) is diffused to dope the silicide 811 and through it the adjacent island. An optional silicide 806 may be formed on the contact trench side walls to reduce resistance in the vertical path of diffusion 855. Also shown in the figure is an N+ contact diffusion 805 in the island surface which overlaps the N+ diffusion 855 (and preferably the side silicide 806 when used) on the side of the contact trench. Interconnect metal (not shown) would contact diffusion 805 through an aperture in the surface oxide (also not shown). The contact trench 810 will typically be filled with polysilicon 807.

Such a contact trench 810 could be used to introduce a P+ dopant into the silicide to make the anode of an IGBT or SCR. An N diffusion might be performed before the P+ diffusion to form a N buffer layer in the island between the P+ and the N– island. It would also form the N isolation layer in the substrate between the silicide and the P type substrate.

Having thus described many embodiments of the invention, those skilled in the art will recognize that further changes, additions, modifications and alterations to the disclosed embodiments may be made without departing from the spirit and scope of the following claims.

What I claim is:

1. A semiconductor device having an ohmic contact to a buried layer comprising:

a device wafer;

a first layer of diffusing material on one surface of the device wafer, said first layer including a first dopant and having a rate of diffusion for said first dopant that is substantially greater than the rate of diffusion in the device wafer for said first dopant;

a first heavily doped layer in said device wafer adjacent the first layer, containing dopant diffused from said first layer and providing ohmic contact between the first layer and the heavily doped layer;

a handle wafer connected to the first layer; and a second heavily doped layer in said handle wafer containing dopant diffused from said first layer and providing ohmic contact between the first layer and the second heavily doped layer.

2. The semiconductor device of claim 1 wherein the device wafer is silicon and the first layer is a silicide.

3. The semiconductor device of claim 2 wherein the silicide is selected from the group consisting of tungsten silicide and titanimum silicide.

4. The semiconductor device of claim 1 wherein the first dopant is one selected from the group consisting of P, As, B, and Sb.

5. The semiconductor device of claim 1 further comprising:

a plurality of isolation trenches, each trench having spaced apart walls and a bottom and extending from the other surface of the device wafer through the first layer to define a plurality of device-islands; and dielectric material on the trench walls adjacent the device wafer.

6. The semiconductor device of claim 5 wherein the walls of the trenches are heavily doped with the first dopant.

7. The semiconductor device of claim 5 wherein a portion of one of the islands at a location adjacent to one of the trenches is heavily doped with said first dopant.

8. The semiconductor device of claim 5 wherein a second device island is heavily doped with a second dopant; and the second dopant from said device island is diffused to the first layer and through the first layer to form a heavily doped layer beneath the second device island in ohmic contact with the first layer.

9. The semiconductor device of claim 5 further comprising channel stops beneath the trenches.

10. The semiconductor device of claim 5 wherein the trenches are coated with a dielectric layer and filled with a semiconductor material.

11. The semiconductor device of claim 10 wherein the dielectric material is silicon dioxide and the semiconductor material is polysilicon.

12. The semiconductor device of claim 5 further comprising a handle wafer oxide bonded to the device wafer wherein the trenches from the other surface of the device wafer extend to the bond oxide.

13. The semiconductor device of claim 1 wherein a portion of the other surface of the device wafer is doped with a second dopant of a polarity different from the polarity of the first dopant.

14. The semiconductor device of claim 13 wherein the second dopant forms a collector.

15. The semiconductor device of claim 1 further comprising:

a surface contact trench extending from the other surface of the device wafer to the first layer;

a coating on the trench of diffusing material of said first layer.

16. A semiconductor device having an ohmic contact to a buried layer comprising:

a silicon device wafer doped with a first dopant of a first polarity;

a handle wafer having a second dopant of a second polarity;

a conductive rapid diffusion layer between the device wafer and the handle wafer;

a first region on the device wafer providing a first isolation diffusion of a dopant of the first polarity;

in said first region a collector diffusion of a dopant of the second polarity;

an epitaxial layer on the device wafer over the isolation diffusion;

means including dielectric isolation trenches and channel stops beneath said trenches for electrically isolating the first region and forming adjoining islands of the device wafer, said adjoining islands being electrically isolated from each other;

a heavily doped region of a first dopant in one of the islands with a first dopant with said first dopant diffused from said heavily doped region to the rapid diffusion layer to form an ohmic contact between the rapid diffusion layer and the island;

wherein said first dopant diffuses into said handle wafer.

17. The semiconductor device of claim 16 wherein the dopant from the first region is diffused to and through the rapid diffusion layer to form an ohmic contact between the rapid diffusion layer and the first island and to form a junction between the handle wafer and the diffused region.

18. A semiconductor device for making an ohmic contact to a buried layer comprising:

a silicon device wafer having an epitaxial layer lightly doped with a first dopant of a first dopant of a first polarity;

a conductive rapid diffusion layer over the epitaxial layer;

a handle wafer lightly doped with a second dopant, and containing said first dopant diffused from said epitaxial layer, said handle wafer being bonded to the rapid diffusion layer;

a plurality of trenches in the epitaxial layer, said trenches extending to the handle wafer and including dielectric material for isolating the trenches from said handle wafer and channel stops in the bottom of the trenches said trenches forming a plurality of epitaxial islands, each island in contact with the rapid diffusion layer; and a heavily doped layer in the islands, beneath the surface of said islands and in ohmic contact with the rapid diffusion layer.

19. The semiconductor for claim 18 further comprising:

an oxide layer on the rapid diffusion layer for oxide bonding the handle wafer to the device wafer.

20. A semiconductor device comprising:

a semiconductor substrate comprised of a device wafer and a handle substrate, the handle substrate having a doping of a one polarity;

a conductive rapid diffusion layer between the device wafer and the handle substrate;

an epitaxial layer having a doping of a polarity opposite the polarity of the substrate and disposed on the conductive rapid diffusion layer and having one or more electronic devices formed in said epitaxial layer;

first and second buried heavily doped layers of a first dopant in ohmic contact with said rapid diffusion layer and each on an opposite surface of said conductive rapid diffusion layer;

a first surface contact;

a deep heavily doped region comprising said first dopant and extending from the first surface contact to one of said buried doped layers;

a gate electrode disposed over the epitaxial layer and electrically isolated therefrom by a gate insulating layer on said epitaxial surface;

wherein said first dopant diffuses into said handle wafer.

21. The semiconductor device of claim 20 wherein the deep heavily doped region comprises a dopant of the same polarity as the epitaxial layer.

22. The semiconductor device of claim 20 wherein the deep heavily doped region comprises a dopant of a polarity opposite the polarity of the doping of the epitaxial layer.

23. The semiconductor device of claim 22 wherein the handle wafer further comprises a layer of a dopant of a second polarity opposite to the polarity of the first dopant and adjacent the second buried layer to form an isolation junction.

24. A semiconductor device comprising:

a semiconductor substrate comprised of a device wafer and a handle substrate, the handle substrate having a doping of a first polarity, the device water having a doping of a second polarity opposite to the doping of the first polarity;

a conductive rapid diffusion layer between the device wafer and the handle substrate;

an isolation trench surrounding an island of the device wafer, said trench filled with material including a dielectric material;

a buried layer contact trench extending from the surface of the island to the conductive rapid diffusion layer and comprising conductive rapid diffusion material on the wall of said surface contact trench; and first and second heavily doped buried layers comprising dopants of a second polarity, said first and second heavily doped buried layers disposed in ohmic contact with the conductive rapid diffusion layer.

25. The semiconductor device of claim 24 wherein further comprising a heavily doped region comprising dopants of a second polarity in the surface of the island adjacent the buried layer contact trench.

26. The semiconductor device of claim 16 further comprising a doped semiconductor layer having ohmic contact to said rapid diffusion layer.

27. The semiconductor device of claim 16 wherein the conductive rapid diffusion layer is a silicide layer.

28. The semiconductor device of claim 18 wherein the conductive rapid diffusion layer is a silicide layer.

29. The semiconductor device of claim 24 wherein said second dopant diffuses into said handle substrate.

30. A semiconductor device comprising:

a semiconductor substrate comprised of a device wafer and a handle substrate, the handle substrate having a doping of a first polarity, the device wafer having a doping of a second polarity opposite to the doping of the first polarity;

a conductive rapid diffusion layer between the device wafer and the handle substrate;

a first diffused layer having a doping of the first polarity, between the rapid diffusion layer and handle substrate, and making ohmic contact with the rapid diffusion layer;

a second diffused layer between the first diffused layer and the handle substrate, having a doping of the second polarity to form PN junctions with the first diffused layer and the handle substrate to provide isolation between the first diffused layer and the handle substrate; and an isolation trench surrounding an island of the device layer and the conductive rapid diffusion layer, said trench filled with material including a dielectric material;

wherein said second polarity dopant diffuses into said handle substrate.

31. The semiconductor device of claim 30 wherein the trench provide lateral isolation.

32. The semiconductor device of claim 30 wherein the island further comprises the diffusion layer.

33. The semiconductor material of claim 30 wherein the conductive rapid diffusion layer is silicide.

34. The semiconductor device of claim 18 further comprising a doped semiconductor layer having ohmic contact to said rapid diffusion layer.

* * * * *